United States Patent [19]
Hatch et al.

[11] Patent Number: 5,198,671
[45] Date of Patent: Mar. 30, 1993

[54] APPARATUS FOR LARGE AREA INFRARED FOCAL PLANE

[75] Inventors: Bert C. Hatch, Yorba Linda; Albert L. Gable, Orange; Leland L. Roberts, Anaheim; Judith Roberts, Santa Rosa, all of Calif., executor of said Leland L. Roberts, deceased

[73] Assignee: Rockwell International Corporation, Seal Beach, Calif.

[21] Appl. No.: 716,476

[22] Filed: Jun. 17, 1991

[51] Int. Cl.⁵ ............................................. G01J 5/04
[52] U.S. Cl. .................. 250/352; 250/370.15
[58] Field of Search ............................ 250/352, 370.15

[56] References Cited

U.S. PATENT DOCUMENTS

| | | | |
|---|---|---|---|
| 4,451,735 | 5/1984 | Diedrich et al. | 250/352 |
| 4,954,708 | 9/1990 | Salzer et al. | 250/352 |

FOREIGN PATENT DOCUMENTS

| | | | |
|---|---|---|---|
| 60-146121 | 8/1985 | Japan | 250/352 |
| 2115602 | 9/1983 | United Kingdom | 250/352 |

*Primary Examiner*—Constantine Hannaher
*Attorney, Agent, or Firm*—H. Fredrick Hamann; George A. Montanye; David J. Arthur

[57] ABSTRACT

An apparatus for housing a focal plane array includes a tubular metal stem for housing a cryostat inside of it, and a hollow conical metal housing having its narrow end brazed onto the end of the tubular metal stem. A ceramic electrical interconnection assembly is rigidly sealed onto the wide end of the housing, having embedded electrical connections for providing electrical connections between the interior and exterior of the assembly. A metal ring-shaped mounting structure is rigidly attached to the ceramic interconnection assembly. A ceramic coldplate is sealed over the other end of the rigid metal tube in the interior of the structure for holding the focal plane array. The rigidity of the structure provides a known positional relationship between the coldplate and the mounting ring, to facilitate positioning the focal plane array during dewar installation. A metal cap is sealed to the mounting ring to provide a reworkable, hermetic closure.

18 Claims, 4 Drawing Sheets

APPARATUS FOR LARGE AREA INFRARED FOCAL PLANE

BACKGROUND OF THE INVENTION

The present invention relates to housings for holding large area infrared focal plane arrays. Such housings are commonly called dewars.

Two of the important criteria for a housing for a focal plane array are to maintain a vacuum around the array, and to keep the array at an extremely low temperature, such as 70-77 kelvin. Because focal planes are typically used in a variety of environments, the vacuum must be maintained for an extended time, such as five to ten years. Therefore, any seals on the structure must be impervious to molecular-sized or larger particles. A common technique for maintaining a low temperature for the focal plane array is to install it over a cryostat.

The structure must be rigid to hold the focal plane array in precise position. Additionally, the structure must be able to withstand the stresses of launch.

In the past, the dewar assemblies have been made of glass because of its high structural rigidity and low thermal conductivity for maintaining the cryostat. Such structures include a tubular member for receiving the cryostat, at one end of which is the focal plane array. A tubular cover covers the focal plane array and the cryostat tube. A window in one end of the cover allows the focal plane array during use to "see" the target. The other end of the cover is sealed to the end of the cryostat tube. The electrical connections to the focal plane array are routed along the length of the cryostat tubular member, inside the cover, and exit through the cover at the base of the structure. Each electrical connection through the cover must be sealed to preserve the vacuum over the focal plane array.

Although rigid, the glass is fragile, and thus is subject to breakage during manufacture, and during launch. In addition, providing the electrical connections between the focal plane array and the external circuitry requires sealing the wire connections through the glass. Such seals between metal and glass are extremely difficult to achieve, and are prone to cracking. Additionally, because of the different coefficients of expansion for the metal and glass, the seals are difficult to maintain during the extreme environmental temperature changes that may take place during manufacturing, testing, launching, and deploying the system in which the structure is installed. Furthermore, the proximity of the wires positioned in parallel along the length of the cryostat tube may give rise to interference between signals on adjacent wires.

Because of a trend toward the use of larger arrays, such as square arrays having 128 or 256 elements to a side, dewars must have an internal volume sufficient to accommodate such large arrays.

SUMMARY OF THE INVENTION

The present apparatus for housing a focal plane includes a tubular metal stem having a first end and a second end, and a hollow conical metal housing having its narrow end welded or brazed to the first end of the tubular stem. An interconnection assembly including a ceramic ring structure is rigidly sealed onto the wide end of the housing. The interconnection assembly includes internal electrical pins within the circumference of the housing wide end, and external electrical pins outside the circumference of the housing wide end, and embedded electrical connections, each connecting one of the internal pins and a corresponding one of the external pins.

A ceramic coldplate is sealed over the second end of the tubular metal stem for receiving the focal plane array. A metal mounting ring is rigidly sealed to the ceramic ring structure. A metal cap having a window through its closed end has its open end rigidly sealed onto the metal mounting ring. A pinch-off tube may be brazed into a third opening through the wall of the housing for use in evacuating the interior of the structure.

DETAILED DESCRIPTION OF THE PREFERRED EMBODIMENT

Figure 1:
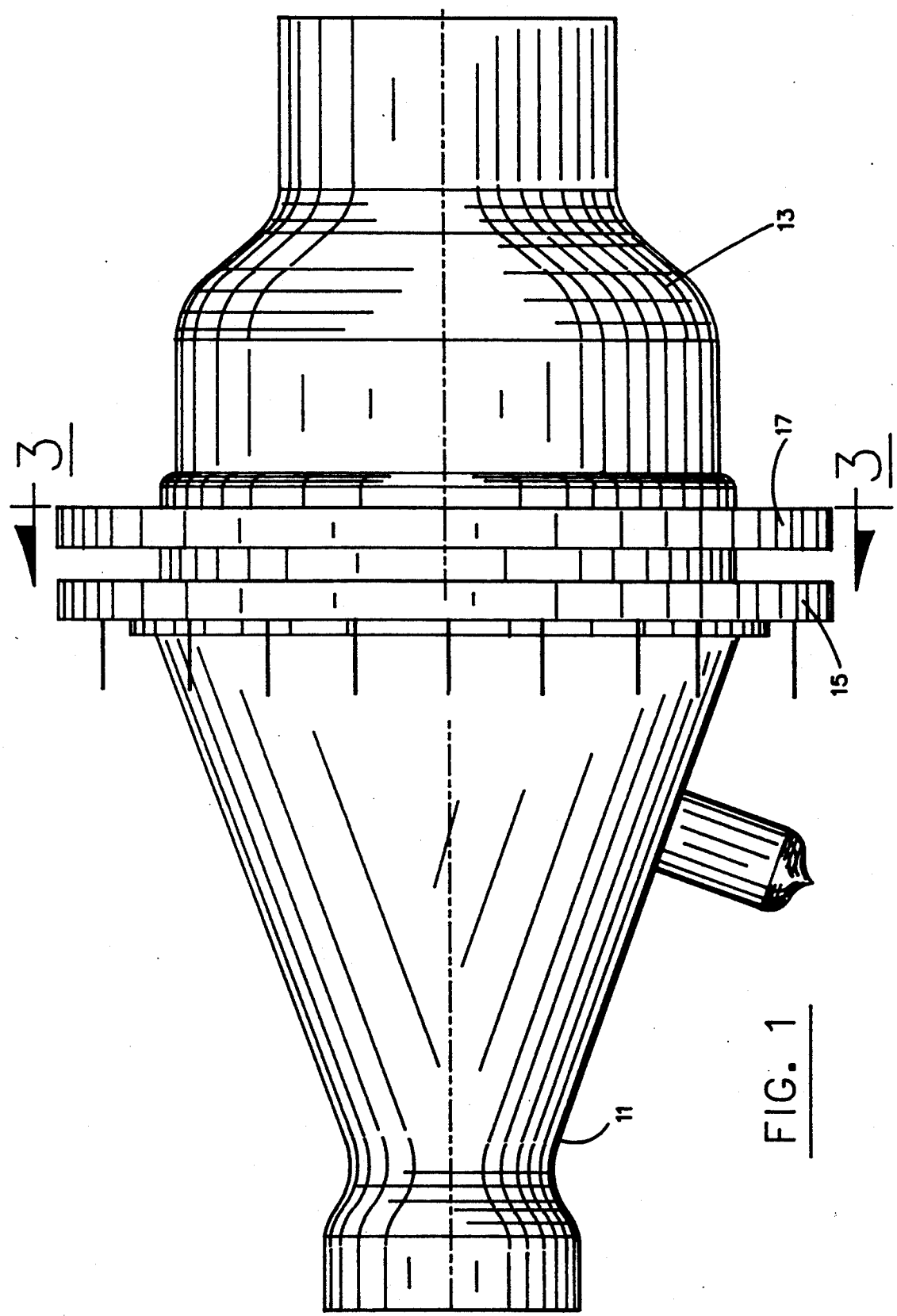
FIG. 1 is an elevational view of a dewar constructed according to the invention.
Figure 2:
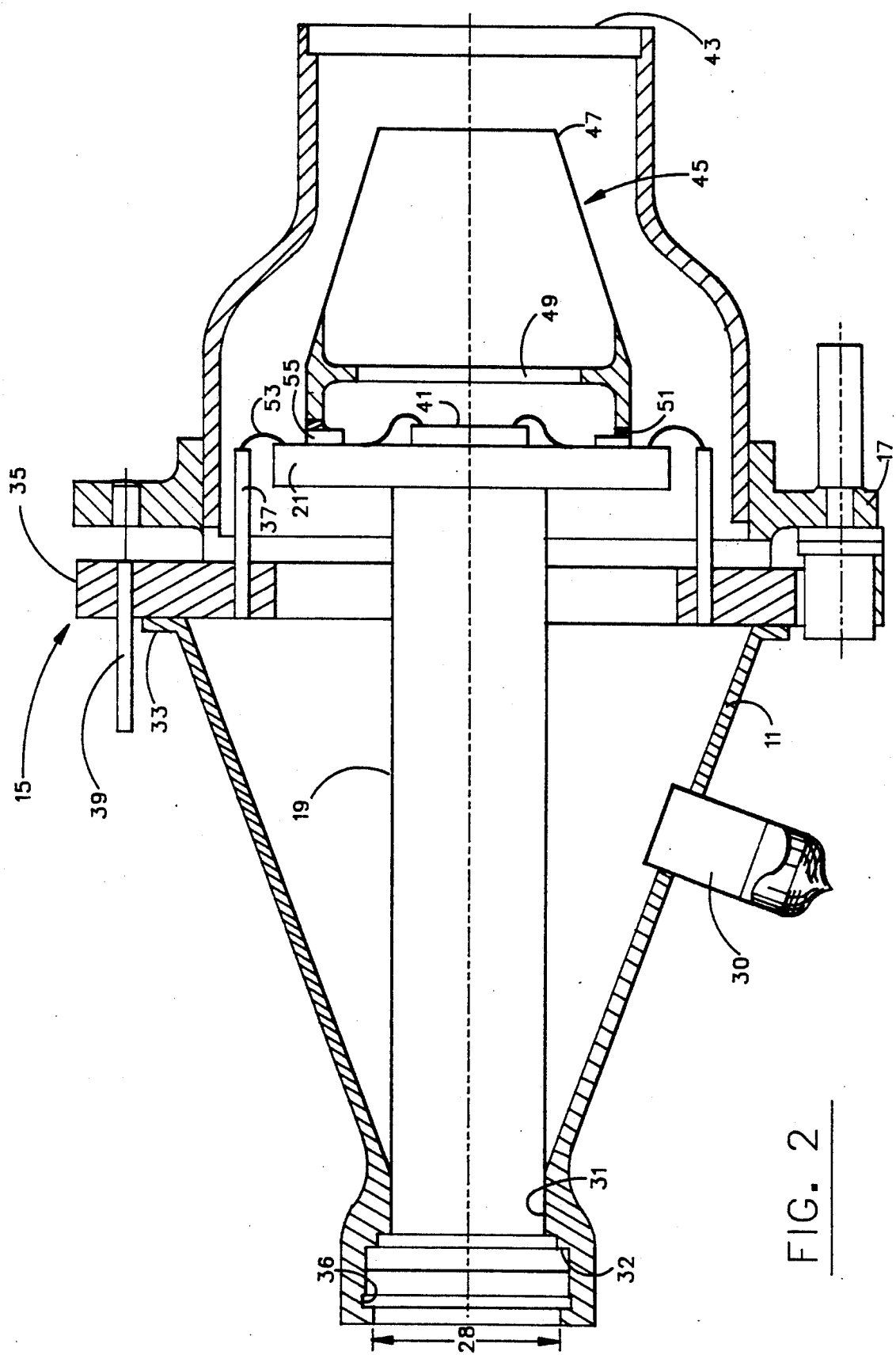
FIG. 2 is a cross-sectional view taken along the axis of a dewar constructed according to the invention.

Referring to FIG. 1, an elevational view of a preferred embodiment of the focal plane housing assembly (dewar) of the invention is provided, showing some of its various components. Such components include a conical metal housing or rear cone 11, and a metal cap structure 13. The cap includes a window in the top to provide a light path to the focal plane array inside the dewar assembly. A ceramic interconnection assembly 15 is sealed between the cap and the conical housing for providing electrical connection between the interior of the structure and the exterior of the structure. A mounting ring 17 may be attached between the interconnect assembly and the cap for mechanical mounting of the dewar assembly into the operating environment. The cross-sectional view of FIG. 2 additionally shows a tubular metal stem 19 along the dewar's axis for holding a cryostat. This stem may be called a cryostat coldwell. Also visible in FIG. 2 is a coldplate 21 sealed across one end of the coldwell. The cap 13, mounting ring 17, conical housing 11, and cryostat coldwell 19 are all made of metal to provide these parts with similar coefficients of thermal expansion. Preferably, these parts are formed of the same metal, so they have identical thermal expansion characteristics. Such use of metal also allows the parts to be easily brazed or laser welded. The interconnect assembly 15 is made of a ceramic material having a very similar coefficient of thermal expansion. Such ceramic also has the ability to be readily brazed or welded on the metal of the housing.

The metal used for the stem, the housing, the mounting ring, and the cap should be extremely rigid, have very low weight, and be machinable to extremely fine tolerances. While numerous metals fit these characteristics, high nickel alloys, Alloy 42, (an alloy of 42 percent nickel ad 58 percent iron) and titanium are particularly appropriate. Each of such materials has a high modulus of elasticity, permitting thin wall design without sacrificing required strength and stiffness characteristics.

With a high nickel alloy, the formed parts may be treated to high temperature thermal processing to reduce outgassing. Typically, the parts are nickel plated, then wet hydrogen fired at 900° to 1000° Centigrade to drive off contaminants and create a non-porous surface, which minimizes surface absorption of water.

The cryostat coldwell 19 is a tubular metal stem, the internal diameter of which is sized to snugly fit the cryostat that is to be later inserted (23, see FIG. 4). The walls of the stem 19 are machined to be very thin, on the order of less than 0.010 inch (0.025 cm), and preferably 0.005 inches (0.0013 cm). Preferably the thickness of the wall is maintained throughout its length to within 0.0005 inches (0.0013 mm). Although the metal forming the stem thus is virtually a foil, once the conical housing 11 and a ceramic cold plate 21 are mated to the ends of the tube, and the cryostat 23 is installed, the entire structure is very rigid. The extreme thinness of the material forming the hollow stem provides the stem with low thermal conductivity.

The inner diameter of the coldwell may be 0.326 inches (0.828 cm). The length of the stem (also called the coldwell depth) may be 1.298 in (3.29 cm).

Figure 4:
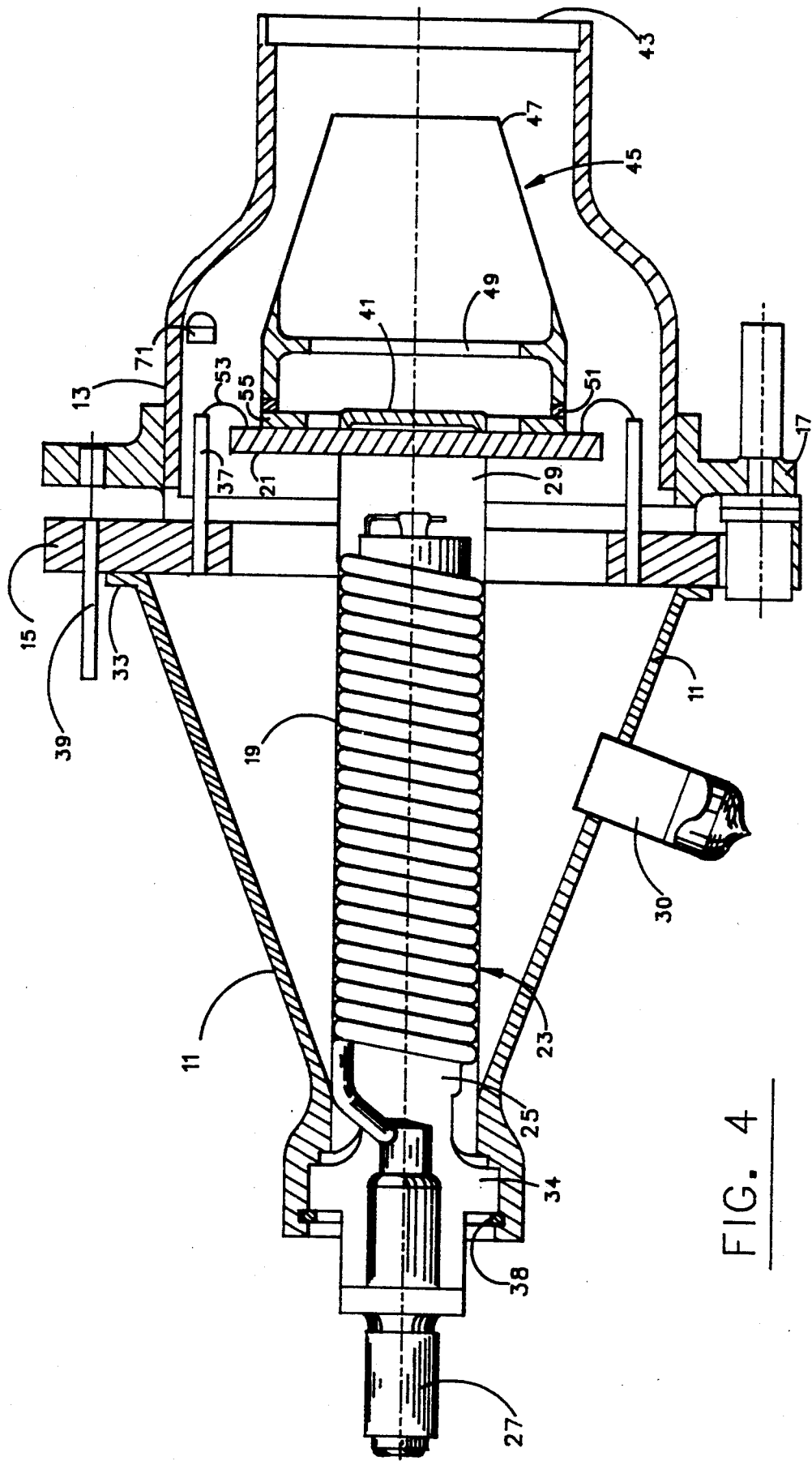
FIG. 4 is a cross-sectional view of the dewar of the invention, showing the cryostat installed.

FIG. 4 illustrates, in cross section, the dewar assembly with the cryostat in place. The cryostat 23, which is commercially available, is a spirally wound tube 25 having an inlet 27 protruding from the end of the coldwell for receiving a high pressure gas such as nitrogen. The outlet end of the tube contains a nozzle in the small space 29 beneath the coldplate 21 that is sealed to the end of the tubular stem. The high pressure gas in injected into this space where it expands and cools very rapidly until it forms a liquid bubble or drop in the space between the coldplate and the top of the cryostat. The low temperature nitrogen flows back down through the stem around the cryostat tube, cooling the gas flowing upward through the tube. In some cryostats, small thermal exchange fins are provided along the tube. However, to maintain the cryostat's efficiency, the flow of gas back down along the outside of the cryostat tube should be kept to a minimum. Thus, the cryostat should have a very snug, friction fit into the tubular metal stem.

Referring again to FIG. 2, the top end of the tubular stem 19 is sealed to the bottom of a cofired ceramic coldplate 21. The coldplate is for receiving the focal plane array. This coldplate may be of a ceramic such as 96% alumina. With such a material the coldplate may be brazed to the end of the stem to create a vacuum seal. This seal should be impervious to molecular sized or larger particles to prevent the nitrogen used in the cryostat from escaping from the coldwell into the interior of the housing 11, which in use contains a vacuum. This seal is also light-tight to keep stray light out of the dewar interior.

The hollow metal housing 11 is welded or brazed to the bottom end of the hollow stem 19. In the illustrated embodiment, this housing 11 has a conical shape with an opening 31 through its narrow end, and open at its large end. The end of the cryostat tube is brazed or welded to the conical housing around the opening through the narrow end of the conical housing. This brazing provides a vacuum seal that is impervious to molecular sized or larger particles to prevent deterioration of the vacuum inside the housing. Laser welding may also be used to attach the hollow stem to the conical housing. This seal, as all the other seals of the structure, is light-tight to keep stray light from the dewar interior, as such stray light will adversely affect the array performance.

The conical shape of the housing provides high stiffness for minimum weight, and also minimizes the internal evacuated volume of the structure.

A pinch-off tube 30 is brazed into an opening through the sidewall of the conical housing. This pinch-off tube is used in evacuating the interior of the dewar assembly. This pinch-off tube is made of a malleable material such as copper, so that it may be readily closed off after the evacuation is complete.

The opening through the narrow end of the housing in the illustrated embodiment also contains a shaped interior for receiving the end of the cryostat. A shoulder 32 in the opening into the housing provides a stop against which the enlarged end 34 of the cryostat may be placed (FIG. 4). This opening through the narrow end of the conical housing also includes a slot 36 for receiving a snap ring 38 (FIG. 4) that fits tightly against the end of the cryostat, to hold the cryostat securely in place. Because of the rigidity of the overall structure, this enables the relative positioning of the inlet end 27 of the cryostat tube to maintain accurately its position relative to the remainder of the dewar assembly, facilitating later installation of the entire assembly. The inner diameter 28 at the mouth of the opening through the narrow end of the housing may be 0.438 inches (1.11 cm). The shoulder 32 of the opening is designed to coincide with the end of the coldwell stem.

The interconnection assembly 15 is rigidly sealed to a flange 33 around the perimeter of the wide end of the conical housing 11. This interconnection assembly provides electrical connection between the interior of the completed dewar assembly and the exterior of the assembly. The interconnection assembly includes a multilayer co-fired ceramic ring structure 35 brazed to the housing flange. The ceramic ring may be formed of alumina, such as a composition of 96% alumina. The inner diameter of the ceramic ring is less than the interior diameter of the large end of the conical housing to provide space for some internal electrical leads or pins 37. The outer diameter of the ceramic ring is greater than the outer diameter of the housing flange to provide room for some external leads or pins 39.

A plurality of internal electrical pins 37 are embedded into the ceramic ring structure around its inner diameter, within the circumference of the wide end of the housing. Alternatively, these pins may be brazed to electrical bonding pads on the surface of the ceramic ring. These internal electrical pins provide electrical connection points inside the housing assembly. These pins may be formed of a gold-plated metal alloy such as Kovar (an alloy of iron and cobalt).

A plurality of external electrical pins 39 is embedded in the ceramic ring structure outside the circumference of the housing wide end to provide electrical contact points external to the housing assembly. Alternatively, these pins may also be brazed to bonding pads on the surface of the ceramic ring.

Electrical connections are embedded between the layers of the ceramic ring structure to provide electrical connection between the internal electrical pins 37 and the external electrical pins 39. Metal vias allow for electrical connection between bonding pads on the ring surface and the embedded electrical connections. Generally, each embedded electrical connection will connect one of the internal pins with a corresponding one of the external pins. Thus, the interconnection assembly 15 provides electrical connection between the interior of the dewar and the exterior.

The surface of the multi-layer ceramic ring 35 may need to be lapped to an adequate level of smoothness to ensure that a vacuum seal is produced when the ceramic ring is brazed to the flange 33 on the conical housing and to the mounting ring described below. The top surface of the ceramic ring 35 may also need to be lapped to an adequate level of smoothness to allow a vacuum seal with the mounting ring 17 brazed onto it.

The metal mounting ring 17 may be brazed or otherwise rigidly attached to the top of the ceramic ring structure. This mounting ring is for physically attaching the dewar assembly onto the system structure into which it is to be installed. This mounting ring may be made substantially co-planar with the coldplate 21 or with the focal plane array 41 as is it would be installed. Because of the rigidity of the assembly of the conical housing 11, cryostat stem 19, interconnection assembly 15, and mounting ring 17, the position of the focal plane mounting plate 21 with respect to the mounting ring 17 is known with great accuracy. This allows accurate positioning of the focal plane array during the installation of the dewar assembly. The mounting ring is preferably formed of the same metal as the conical housing 11 and the cap 13. This material may be for example Alloy 42 or titanium.

The metal cap 13 has a window 43 through its closed end and has its open end rigidly sealed to the mounting ring 17. This attachment or seal may be formed by brazing or by laser welding. If a laser weld of approximately eight mil (0.008 in or 0.020 cm) is used, the cap may be removed later in the assembly process, should it become necessary to replace or otherwise work with the focal plane array or any of the internal electrical connections inside the dewar assembly. Thus, a reworkable, hermetic closure is provided.

The cap or cover preferably is formed of the same metal as the conical housing 11, and has the window 43 soldered into one end of it for the light to enter for the focal plane or hybrid array 41 after assembly is completed. The shape of the cover or cover is essentially arbitrary, as the cover is not a load bearing part of the dewar structure. The illustrated cap has a height of 0.825 in (2.10 cm) above the surface of the installed focal plane array 41 and a window diameter of 0.531 in (1.35 cm).

Inside the cover may be a coldshield 45, which may also be formed of the same metal as the other components, namely Alloy 42 or titanium, or may be formed of a different metal such as aluminum. This coldshield may be a tubular or conical structure having one end adhesively bonded to the ceramic coldplate 21 holding the focal plane array and the other end remote from the coldplate and focal plane array, but spaced from the window 43 in the cap or cover 13. The coldshield may have a height of 0.665 in (1.69 cm) above the surface of the installed focal plane array 41. The top opening diameter may be 0.295 in (0.749 cm). One of the purposes of the coldshield is to provide an aperture accurately positioned and sized with respect to the focal array. A lens (not shown) may be placed in the second end (the smaller end) 47 of the coldshield to provide accurate fixing of the focal point of light entering the assembly onto the focal plane array. Additionally, an optical filter 49 may be installed in the coldshield.

The adhesive bond 51 attaching the coldshield 45 to the coldplate 21 provides sufficient flexibility prior to its setting to allow the coldshield to be carefully aligned with the focal plane array. A low out gassing epoxy is used as the adhesive. Low outgassing properties are desired in the adhesive to minimize contamination of the vacuum inside the chamber. The adhesive bond of the coldshield to the coldplate should be light-tight to avoid stray light interfering with the operation of the focal plane.

The focal plane array 41, such as a mercury cadmium telluride (MCT) hybrid array, is mounted on the ceramic coldplate with an adhesive in the manner known in the art. Wires 53 provide electrical conduction from the bond out pads around the perimeter of the hybrid array under the edge of the coldshield, to connect with the internal electrical connections 37 on the interconnection assembly. A ceramic insulator 55 around the perimeter of the base of the coldshield provides electrical insulation of the coldshield from the bond wires.

The structure may be assembled in two stages. In the first stage, three subassemblies may be formed. These subassemblies may be the stem 19 and the coldplate 21, the mounting ring 17 and the header or interconnection assembly 15, and the housing 11 and the pinch-off tube 30. In the second stage of the assembly, these subassemblies are joined together.

Figure 3:
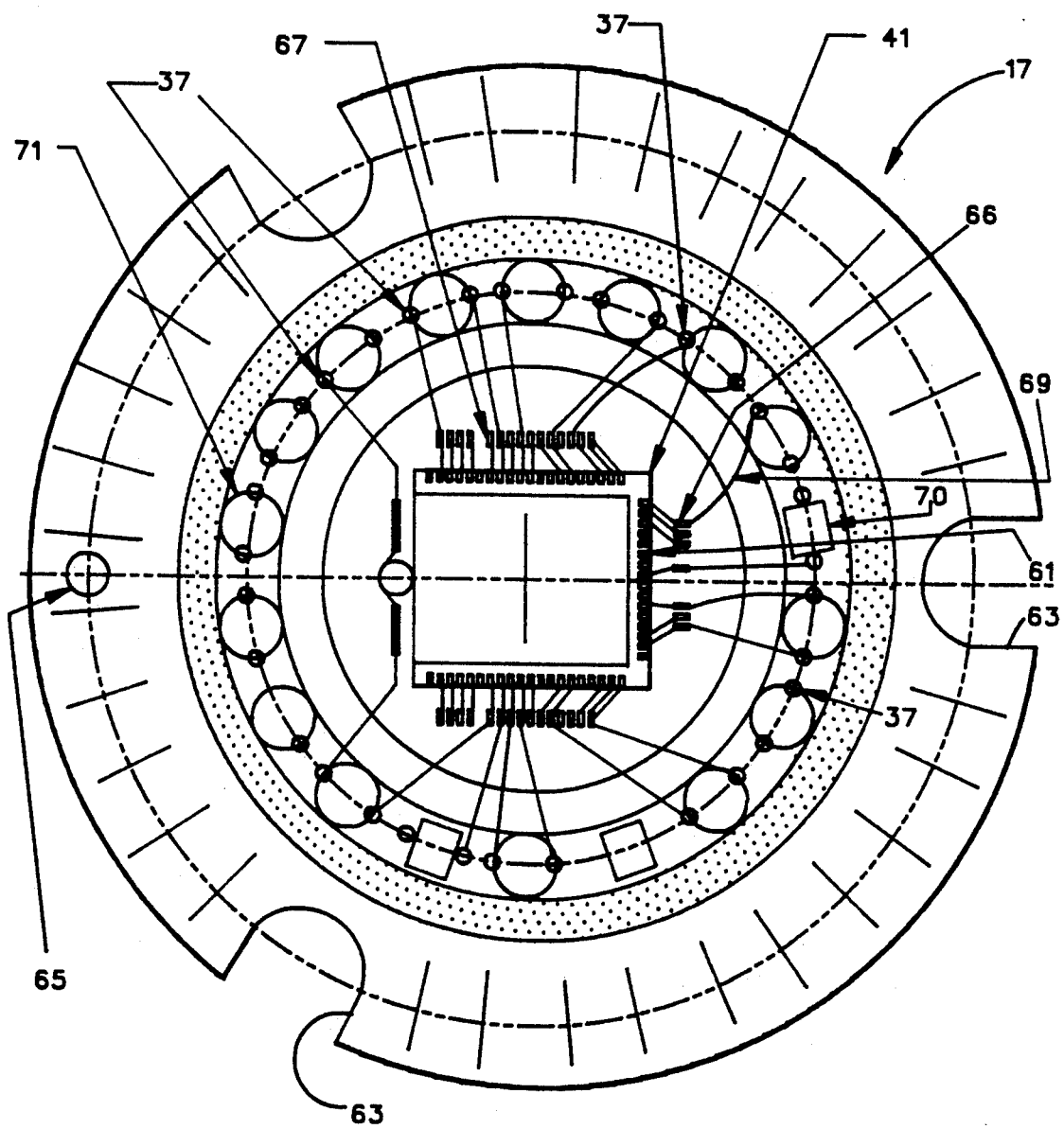
FIG. 3 is a cross-sectional view taken along line 3—3 of FIG. 1, showing the mounting of the focal plane array, the mounting ring, and a portion of the electrical interconnection assembly.

FIG. 3 is a top view of the assembly with the cap and coldshield removed, showing the mounting of the hybrid array 41 and the electrical connections between the bond-out pads 61 on the array and some of the internal electrical connection pins 37 on the ceramic connection assembly. Visible in this figure also are the slots 63 in the mounting ring for receiving mounting screws, and an opening 65 through the mounting ring for an alignment pin.

As illustrated in FIG. 3, some connection wires may not connect directly between the array bond-out pads and the internal connection pins in the connection ring. Rather, wires 66 may connect the bond-out pads 61 on the array with pads 67 on the ceramic coldplate, with separate wires 69 connecting the coldplate pads with the internal electrical connection pins 37.

Yet another option is to embed connection circuitry into the ceramic coldplate, providing separate pads on the coldplate for wire connections to the array bond-out pads and for the wire connections to the internal electrical pins of the ceramic connection ring.

Capacitors 70 may be installed on the ceramic interconnection ring with a conductive epoxy on their bottom sides, and are wire-bonded to the pins 37.

Because the length of connection wire to the internal electrical pins, and thus on to the external electrical pins is rather short, the wire should be made of a material having poor thermal conductivity to minimize the amount to heat transferred from the ambient environment to the hybrid array. For example, manganan, a copper-nickel alloy may be used. Constantan may also be used for those wires.

If conventional wire bonding techniques are troublesome because of material incompatibility, gold-ball captured wire bonding may be employed.

After the dewar is closed, the interior is evacuated through the pinch-off tube 30 while the assembly is baked at a high temperature (such as 105° Centigrade) for several days, perhaps 3–5 days. After the copper tube 30 is closed, getters 71 welded into the structure's interior may be fired to remove any residual outgassing.

All of the adhesive bonding, laser welding, and brazing techniques used in assembling the structure should be performed carefully to ensure that a clean attachment is provided that does not hold moisture or gasses that could contaminate the vacuum environment of the interior of the structure, and to ensure that the vacuum is held for a long time.

Using the construction shown in the illustrated embodiment with a high nickel alloy, the dewar mass can be kept to less than 55 grams. This low mass is important to conserving weight in the vehicle, and allows for easy and precise movement of the dewar during operation.

Although a preferred embodiment of the structure has been described, those skilled in the art will recognize that certain modifications may be made to the structure without departing from the scope of the invention as defined in the attached claims.

We claim:

1. An apparatus for housing a focal plane array, the apparatus comprising:
   a tubular metal stem having a first end and a second end;
   a hollow conical metal housing having a narrow end and a wide end, wherein said housing has a first opening through said narrow end, and a second opening through said wide end, wherein said first end of said stem is brazed into said first housing opening;
   an interconnection assembly comprising a ceramic ring structure rigidly sealed onto said wide end of said housing, said interconnection assembly including internal electrical pins within the circumference of said housing wide end, external electrical pins outside the circumference of said housing wide end, and embedded electrical connections, each of said embedded electrical connections connecting one of said internal pins and a corresponding one of said external pins.,
   a ceramic cold plate sealed over said second end of said tubular metal stem;
   a mounting ring rigidly sealed to said ceramic ring structure; and
   a metal cap having a window through its closed end, and having its open end rigidly sealed onto said mounting ring.

2. The apparatus of claim 1, additionally comprising a tubular cold shield having a first end sealed to said coldplate and a second end remote from said coldplate and spaced from said window in said cap, said cold shield having its axis substantially collinear with the axis of said tubular metal stem.

3. The apparatus of claim 2, wherein said second end of said cold shield has a smaller diameter than said first end of said cold shield.

4. The apparatus of claim 3, additionally comprising an electrical insulator sealed between said cold plate and said cold shield.

5. The apparatus of claim 1, wherein said tubular metal stem, said conical housing, and said metal cap are formed of a nickel alloy.

6. The apparatus of claim 1, wherein said tubular metal stem, said conical housing, and said metal cap are formed of an alloy consisting essentially of 42% nickel and 58% iron.

7. The apparatus of claim 1, wherein said tubular metal stem, said conical housing, and said metal cap are formed of titanium.

8. The apparatus of claim 1, wherein said tubular metal stem, said conical housing, said metal cap, and said mounting ring are formed of metal.

9. The apparatus of claim 8, wherein said mounting ring is rigidly sealed to the top surface of said interconnection assembly.

10. The apparatus of claim 9, wherein said mounting ring is substantially coplanar with said ceramic cold plate.

11. An apparatus for housing a focal plane array, the apparatus comprising:
    a tubular metal formed of a first, rigid, metal, stem having a first end and a second end;
    a hollow conical housing formed of said first metal, said housing having a narrow end and a wide end, wherein said housing has a first opening through said narrow end, a second opening through said wide end, and a third opening through the wall of said housing, wherein said first end of said stem is rigidly sealed into said first housing opening;
    an interconnection assembly comprising a ring shaped, multi-layer ceramic structure rigidly sealed onto said wide end of said housing, said interconnection assembly including internal electrical pins within the circumference of said housing wide end, external electrical pins outside the circumference of said housing wide end, and embedded electrical connections, each of said embedded electrical connections connecting one of said internal pins and a corresponding one of said external pins;
    a ring shaped mounting structure rigidly sealed to said ring shaped ceramic structure;
    a cap formed of said first metal, said cap having a window through its closed end, and having its open end rigidly sealed onto said ring shaped mounting structure;
    a pinch-off tube rigidly sealed into said third opening through the wall of said housing, wherein said pinch-off tube is formed of a second, malleable, metal;
    a ceramic cold plate sealed over said second end of said tubular metal stem;
    a tubular cold shield having a first end sealed to said coldplate and a second end, smaller in diameter than said first end, remote from said coldplate and spaced from said window in said cap, said cold shield having its axis substantially collinear with the axis of said tubular stem; and
    a cryostat inserted into said stem, said cryostat comprising a spiral wound tube having a first end and a second end, wherein said first end protrudes from said first end of said stem, and wherein said second end is spaced a small distance from said cold plate sealed across said second end of said stem; and
    a snap ring inserted into said narrow end of said housing for holding said cryostat in place.

12. The apparatus of claim 11, wherein said first metal is an alloy consisting essentially of 42% nickel and 58% iron.

13. The apparatus of claim 11, wherein said first metal is a nickel alloy.

14. The apparatus of claim 11, wherein said first metal is titanium.

15. The apparatus of claim 11, wherein said mounting ring is substantially coplanar with said cold plate.

16. The apparatus of claim 15, wherein said mounting ring is rigidly sealed to the top surface of said interconnection assembly.

17. The apparatus of claim 11, wherein said mounting ring is rigidly sealed to the top surface of said interconnection assembly.

18. An apparatus for housing a focal plane array, the apparatus comprising:
- a tubular metal stem having a first end and a second end;
- a hollow conical metal housing having a narrow end and a wide end, wherein said housing has a first opening through said narrow end, and a second opening through said wide end, wherein said first end of said stem is brazed into said first housing opening;
- an interconnection assembly comprising a ceramic ring structure rigidly sealed onto said wide end of said housing, said interconnection assembly including internal electrical pins within the circumference of said housing wide end, external electrical pins outside the circumference of said housing wide end, and embedded electrical connections, each of said embedded electrical connections connecting one of said internal pins and a corresponding one of said external pins;
- a ceramic cold plate sealed over said second end of said tubular metal stem;
- a mounting ring rigidly sealed to said ceramic ring structure, wherein said mounting ring is substantially coplanar with said ceramic cold plate; and
- a metal cap having a window through its closed end, and having its open end rigidly sealed onto said mounting ring.

* * * * *